(12) United States Patent
Kim

(10) Patent No.: US 7,580,238 B2
(45) Date of Patent: Aug. 25, 2009

(54) ELECTROSTATIC CHUCK STRUCTURE FOR SEMICONDUCTOR MANUFACTURING APPARATUS

(75) Inventor: In Jun Kim, Seoul (KR)

(73) Assignee: Dongbu Hitek Co., Ltd., Seoul (KR)

( * ) Notice: Subject to any disclaimer, the term of this patent is extended or adjusted under 35 U.S.C. 154(b) by 0 days.

(21) Appl. No.: 12/122,496

(22) Filed: May 16, 2008

(65) Prior Publication Data
US 2008/0285204 A1    Nov. 20, 2008

(30) Foreign Application Priority Data
May 18, 2007    (KR) .................... 10-2007-0048558

(51) Int. Cl.
*H01T 23/00*    (2006.01)
(52) U.S. Cl. .................. 361/234; 361/230; 361/231; 361/232; 361/233; 279/128
(58) Field of Classification Search ......... 361/230–235; 279/128
See application file for complete search history.

(56) References Cited

U.S. PATENT DOCUMENTS

| | | | |
|---|---|---|---|
| 4,692,836 A | * | 9/1987 | Suzuki ........................ 361/234 |
| 5,530,616 A | | 6/1996 | Kitabayashi et al. |
| 5,745,331 A | * | 4/1998 | Shamouilian et al. ........ 361/234 |
| 5,777,838 A | * | 7/1998 | Tamagawa et al. .......... 361/234 |
| 6,608,745 B2 | * | 8/2003 | Tsuruta et al. .............. 361/234 |
| 6,992,876 B1 | * | 1/2006 | Nakajima et al. ........... 361/234 |

FOREIGN PATENT DOCUMENTS

| | | |
|---|---|---|
| KR | 0142055 | 7/1998 |
| KR | 1020030008724 | 1/2003 |

* cited by examiner

*Primary Examiner*—Fritz M Fleming
*Assistant Examiner*—Terrence R Willoughby
(74) *Attorney, Agent, or Firm*—Workman Nydegger

(57) ABSTRACT

An electrostatic chuck structure according to example embodiments of the present invention may include at least one specific region of a conductor having a thickness relatively smaller than those of other regions, at least one specific region of a dielectric having a thickness relatively larger than those of other regions, or at least one specific region of a conductor having a thickness relatively smaller than those of other regions and at least one specific region of a dielectric having a thickness relatively larger than those of other regions. Therefore, etching rate and CD uniformity can be improved during a semiconductor manufacturing process.

5 Claims, 5 Drawing Sheets

US 7,580,238 B2

ELECTROSTATIC CHUCK STRUCTURE FOR SEMICONDUCTOR MANUFACTURING APPARATUS

CROSS-REFERENCE TO RELATED APPLICATION

This application claims priority to Korean Application No. 10-2007-0048558, filed on May 18, 2007, which is incorporated herein by reference in its entirety.

BACKGROUND

1. Field of the Invention

Embodiments of the present invention relate to electrostatic chuck structures for a semiconductor manufacturing apparatus suitable for performing an etching process on a semiconductor wafer in an etching chamber.

2. Background of the Invention

Semiconductor devices are typically manufactured by forming a film on a semiconductor substrate and forming a specific pattern in the film to have an electrical characteristic.

The specific pattern may be formed by repeatedly performing a series of processes, such as chemical vapor deposition, sputtering, photolithography, etching, ion injection, and chemical and mechanical polishing. During the processes, a wafer chuck for supporting and fixing a semiconductor wafer may be used.

Semiconductor wafer processing technology that manufactures fine and large-capacity semiconductor devices may use single wafer processing and dry processing. Accordingly, where the semiconductor wafer has previously been fixed in place for processing by means of clamp or vacuum, an electrostatic chuck (ESC) is now widely used to fix the semiconductor wafer in place by an electrostatic force. The ESC may also supply a temperature regulating gas for uniformly maintaining the temperature of the semiconductor wafer.

FIG. 1, illustrates one example of a typical electrostatic chuck that fixes a semiconductor wafer by an electrostatic force. In this example, the electrostatic chuck is a ceramic type that includes an insulator and a conductor. The ceramic type electrostatic chuck may have a DC power supply for power application, a conductor to which DC power is applied, and an insulator surrounding the conductor. This electrostatic chuck supports the semiconductor wafer by an electrostatic force (e.g., Coulomb force). That is, power may be applied between the semiconductor wafer on the electrostatic chuck and a conductor electrode, such that positive and negative charges may be generated in the semiconductor wafer and the conductor electrode. Then, the semiconductor wafer is supported by the electrostatic force acting between the positive and negative charges.

However, in this type of electrostatic chuck implementation, in order to improve an etching rate of the semiconductor wafer on the electrostatic chuck and critical dimension (CD) uniformity, it is frequently necessary to adjust parameters, such as a kind of plasma source, processing conditions, and a gas distribution panel (GDP). The adjustment(s) may be complex, and such complexity causes an increase in an error rate in the manufacturing process, which deteriorates yield of the semiconductor device. There is thus a need for a new structure for an electrostatic chuck capable of improving the etching rate and the CD uniformity.

SUMMARY OF SOME EXAMPLE EMBODIMENTS

In general, example embodiments of the invention relate to an electrostatic chuck structure for a semiconductor manufacturing apparatus that is capable of improving etching rate and CD uniformity by forming a conductor of an electrostatic chuck such that a specific region of the conductor has a thickness smaller than those of other regions.

Other embodiments relate to an electrostatic chuck structure for a semiconductor manufacturing apparatus that is capable of improving etching rate and CD uniformity by forming a dielectric of an electrostatic chuck such that a specific region of the dielectric has a thickness smaller than those of other regions.

Thus, according to a first embodiment, there is provided an electrostatic chuck structure for a semiconductor manufacturing apparatus that constitutes an electrostatic chuck for fixing a semiconductor wafer during a semiconductor manufacturing process. The electrostatic chuck structure may include: a power supply for supplying electrical power; a conductor to which the electrical power is supplied, at least one specific region thereof having a thickness smaller than those of other regions; a dielectric surrounding the conductor with a substantially uniform thickness; and a gas supply unit passing through the conductor and the dielectric to supply cooling gas.

According to a second embodiment, there is provided an electrostatic chuck structure for a semiconductor manufacturing apparatus that constitutes an electrostatic chuck for fixing a semiconductor wafer during a semiconductor manufacturing process. The electrostatic chuck structure may include: a power supply for supplying electrical power; a conductor having a substantially uniform thickness to which the electrical power is supplied; a dielectric surrounding the conductor, at least one specific region thereof having a thickness larger than those of other regions; and a gas supply unit passing through the conductor and the dielectric to supply cooling gas.

According to a third embodiment, there is provided an electrostatic chuck structure for a semiconductor manufacturing apparatus which constitutes an electrostatic chuck for fixing a semiconductor wafer during a semiconductor manufacturing process. The electrostatic chuck structure may include: a power supply for supplying electrical power; a conductor to which the electrical power is supplied, at least one specific region thereof having a thickness smaller than those of other regions; a dielectric surrounding the conductor, at least one specific region thereof having a thickness larger than those of other regions; and a gas supply unit passing through the conductor and the dielectric to supply cooling gas.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Additional features will be set forth in the description which follows, and in part will be obvious from the description, or may be learned by the practice of the teachings herein. Features of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

Aspects of example embodiments of the invention will become apparent from the following description of example embodiments given in conjunction with the accompanying drawings, in which.

DETAILED DESCRIPTION OF SOME EXAMPLE EMBODIMENTS

Figure 1:
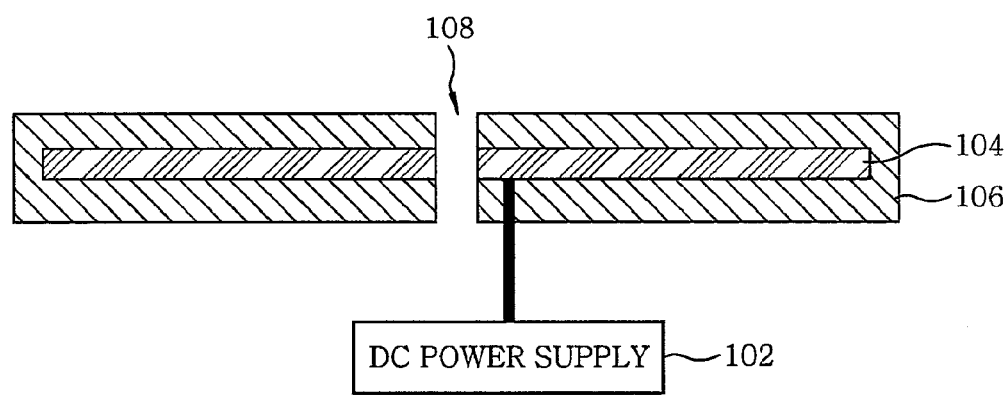
FIG. 1 is a diagram illustrating the structure of a known electrostatic chuck having a conductor and a dielectric.

In the following detailed description of the embodiments, reference is made to the accompanying drawings that show, by way of illustration, specific embodiments of the invention. In the drawings, like numerals describe substantially similar components throughout the several views. These embodiments are described in sufficient detail to enable those skilled in the art to practice the invention. Other embodiments may be utilized and structural, logical and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the full scope of equivalents to which such claims are entitled.

In general, embodiments of the present invention relate to an electrostatic chuck for supporting and fixing a semiconductor wafer. In disclosed examples and as will be described in further detail below, a specific region of a conductor or a dielectric may have a thickness relatively smaller or larger than those of other regions.

FIGS. 2A to 2F are diagrams illustrating the structure of an electrostatic chuck according to an embodiment in which a specific region of a conductor is thinned. An electrostatic chuck structure shown in each of FIGS. 2A to 2F may include a DC power supply 202, a corresponding one of conductors 204a to 204f, a dielectric 206, and a gas supply unit 208. In each of the conductors 204a to 204f, a thickness of a thin region is denoted a, and a thickness of a thick region is denoted b.

Figure 2A:
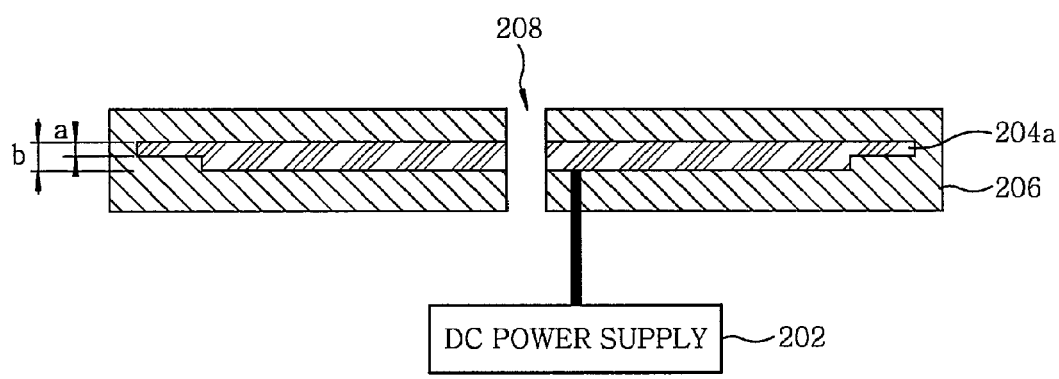
FIGS. 2A to 2F are diagrams illustrating the structure of an electrostatic chuck according to an embodiment of the present invention in which a specific region of a conductor is thinned.

Referring to FIG. 2A, an electrostatic chuck structure may include: a DC power supply 202 for supplying positive (+) or negative (−) DC power; a conductor 204a functioning as an electrode, to which DC power may be supplied, to generate an electrostatic force; a dielectric 206 surrounding the conductor 204a, the dielectric 206 being made of a polyimide-based ceramic material; and a gas supply unit 208 for supplying cooling gas, such as helium (He) gas.

Here, at least one specific region of the conductor 204a has a thickness relatively smaller than those of other regions. For example, the thickness a of the specific region may be in a range of 0.2 to 0.5 mm and the thickness b of a region excluding the specific region may be in a range of 1 to 2 mm. Referring to FIG. 2A, the specific region of the conductor 204a may be formed by making a lower region at each end thereof thin.

Figure 2B:
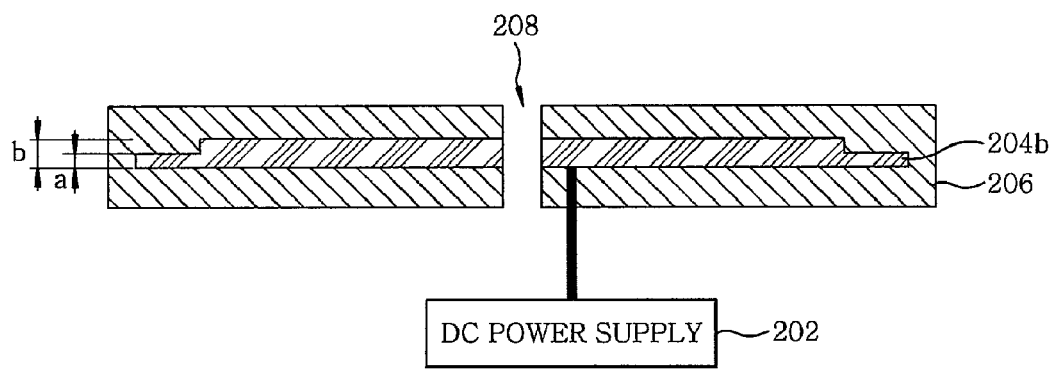

Referring to next to FIG. 2B, an electrostatic chuck structure may include: a DC power supply 202 for supplying positive (+) or negative (−) DC power; a conductor 204b functioning as an electrode, to which DC power may be supplied, to generate an electrostatic force; a dielectric 206 surrounding the conductor 204b, the dielectric 206 being made of a polyimide-based ceramic material; and a gas supply unit 208 for supplying cooling gas, such as helium (He) gas.

Here, at least one specific region of the conductor 204b has a thickness relatively smaller than those of other regions. For example, the thickness a of the specific region may be in a range of 0.2 to 0.5 mm and the thickness b of a region excluding the specific region may be in a range of 1 to 2 mm. In the example of FIG. 2B, the specific region of the conductor 204b may be formed by making an upper region at each end thereof thin.

Figure 2C:
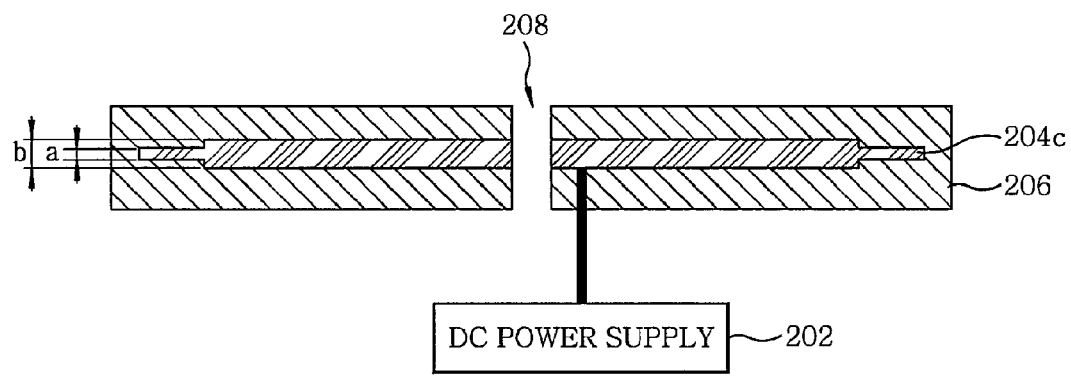

Referring next to the example of FIG. 2C, an electrostatic chuck structure may include: a DC power supply 202 for supplying positive (+) or negative (−) DC power; a conductor 204c functioning as an electrode, to which DC power may be supplied, to generate an electrostatic force; a dielectric 206 surrounding the conductor 204c, the dielectric 206 being made of a polyimide-based ceramic material; and a gas supply unit 208 for supplying cooling gas, such as helium (He) gas.

Here, at least one specific region of the conductor 204c has a thickness relatively smaller than those of other regions. For example, the thickness a of the specific region may be in a range of 0.2 to 0.5 mm and the thickness b of a region excluding the specific region may be in a range of 1 to 2 mm. In the example of FIG. 2C, the specific region of the conductor 204c may be formed by making upper and lower regions at each end thereof thin.

Figure 2D:
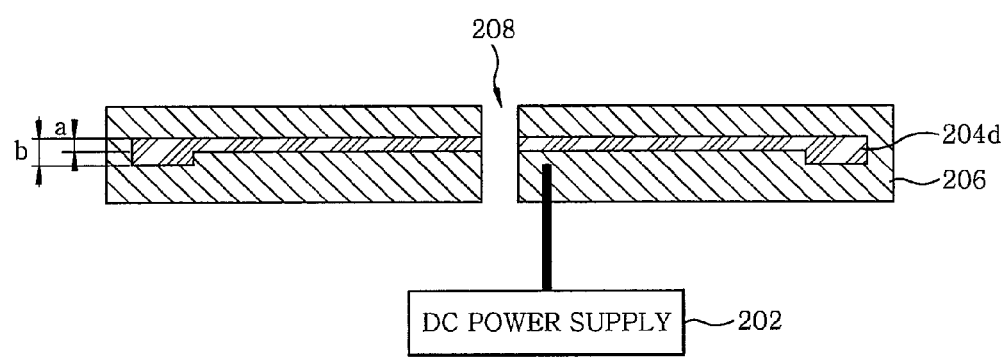

Referring to next to FIG. 2D, an electrostatic chuck structure may include: a DC power supply 202 for supplying positive (+) or negative (−) DC power; a conductor 204d functioning as an electrode, to which DC power may be supplied, to generate an electrostatic force; a dielectric 206 surrounding the conductor 204d, the dielectric 206 being made of a polyimide-based ceramic material; and a gas supply unit 208 for supplying cooling gas, such as helium (He) gas.

Here, at least one specific region of the conductor 204d has a thickness relatively smaller than those of other regions. For example, the thickness a of the specific region may be in a range of 0.2 to 0.5 mm and the thickness b of a region excluding the specific region may be in a range of 1 to 2 mm. In the example of FIG. 2D, the specific region of the conductor 204d may be formed by making a lower region at a central portion thereof thin.

Figure 2E:
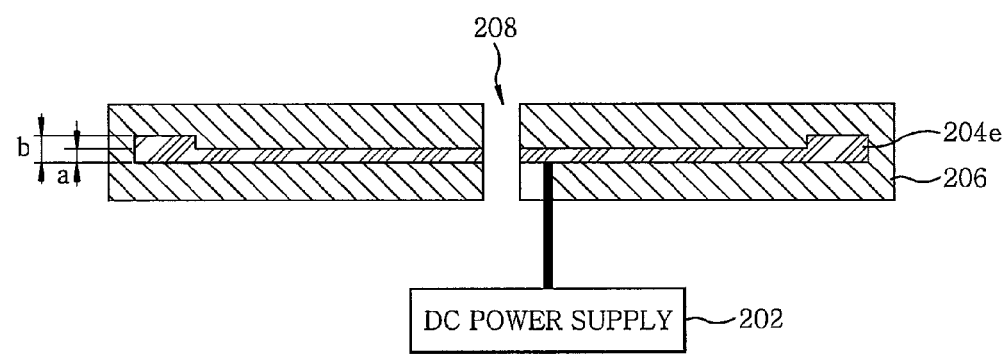

Referring next to FIG. 2E, an electrostatic chuck structure may include: a DC power supply 202 for supplying positive (+) or negative (−) DC power; a conductor 204e functioning as an electrode, to which DC power may be supplied, to generate an electrostatic force; a dielectric 206 surrounding the conductor 204e, the dielectric 206 being made of a polyimide-based ceramic material; and a gas supply unit 208 for supplying cooling gas, such as helium (He) gas.

Here, at least one specific region of the conductor 204e has a thickness relatively smaller than those of other regions. For example, the thickness a of the specific region may be in a range of 0.2 to 0.5 mm and the thickness b of a region excluding the specific region may be in a range of 1 to 2 mm. In the example of FIG. 2E, the specific region of the conductor 204e may be formed by making an upper region at a central portion thereof thin.

Figure 2F:
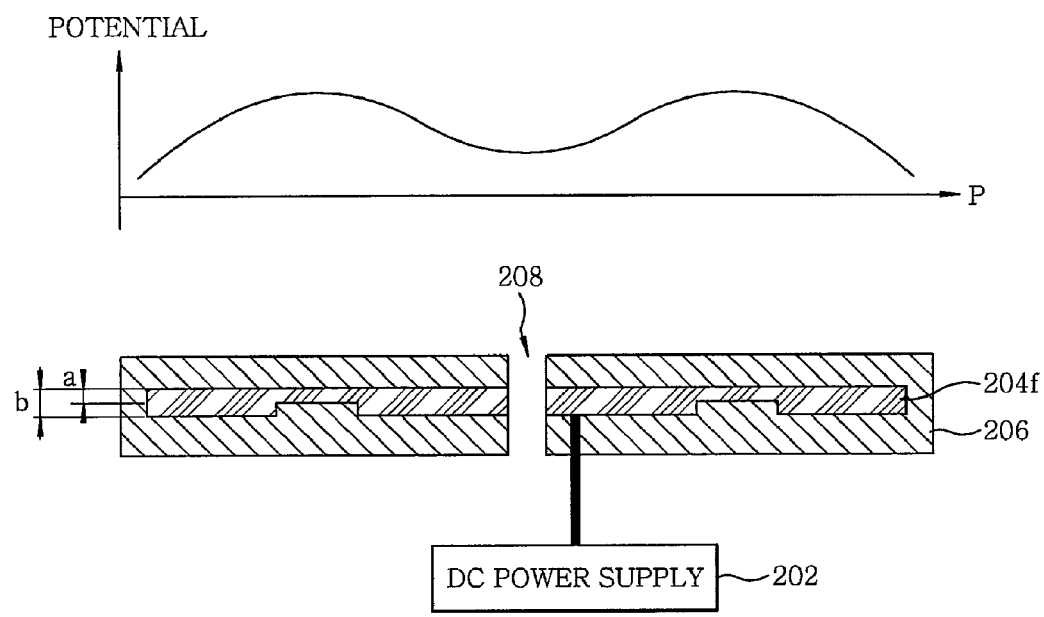

Referring next to the embodiment of FIG. 2F, an electrostatic chuck structure may include: a DC power supply 202 for supplying positive (+) or negative (−) DC power; a conductor 204f functioning as an electrode, to which DC power may be supplied, to generate an electrostatic force; a dielectric 206 surrounding the conductor 204f, the dielectric 206 being made of a polyimide-based ceramic material; and a gas supply unit 208 for supplying cooling gas, such as helium (He) gas.

Here, at least one specific region of the conductor 204f has a thickness relatively smaller than those of other regions. For example, the thickness a of the specific region may be in a range of 0.2 to 0.5 mm and the thickness b of a region excluding the specific region may be in a range of 1 to 2 mm. In this example, the specific region of the conductor 204f may be formed by making a lower region at a portion spaced by a predetermined distance from each end thereof thin.

A graph illustrating plasma distribution characteristics is shown above the electrostatic chuck structure of FIG. 2F where y-axis denotes a potential and x-axis denotes a plasma distribution. As shown in the graph, the potential varies with the electrostatic chuck structure, which causes the difference in electrostatic chucking forces to attract ions in plasma in a direction of a semiconductor wafer. Therefore, it is possible to control the uniformity of an etching rate by the electrostatic chucking forces.

In each of the above-described electrostatic chuck structures an electrostatic chucking force is changed. If the force is large, the etching rate is increased and the CD uniformity is decreased. On the other hand, if the force is small, the etching rate is decreased and the CD uniformity is increased. The etching rate and the CD uniformity depend in part on the electrostatic chucking force because the electrostatic chucking force influences a cooling effect of a cooling gas, such as helium, to be supplied on the back side of the semiconductor wafer.

With the electrostatic chuck in which the specific region of the conductor has a different thickness, thereby affecting the electrostatic chucking force and in turn the cooling effect of the cooling gas, the etching rate and the CD uniformity can be improved.

Figure 3A:
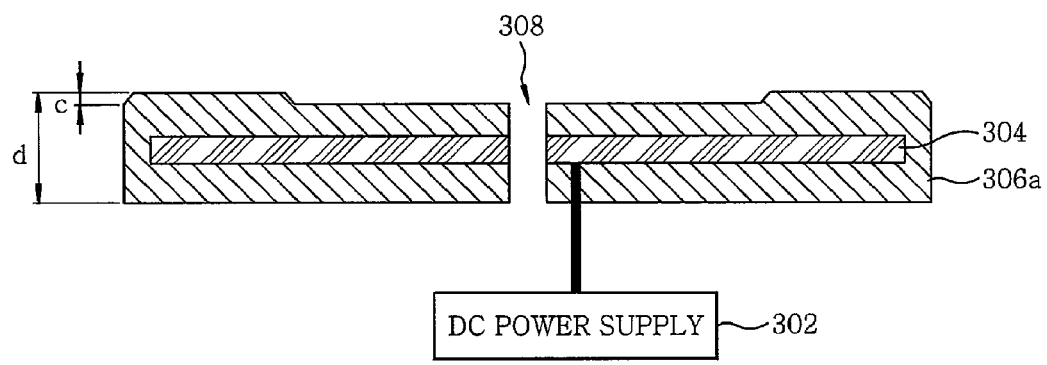
FIGS. 3A to 3C are diagrams illustrating the structure of an electrostatic chuck according to another embodiment of the present invention in which a specific region of a dielectric is thickened.
Figure 3B:
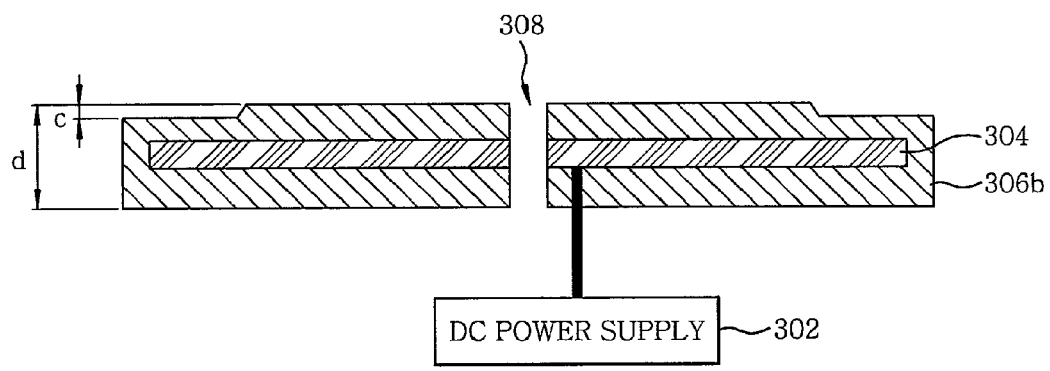
Figure 3C:
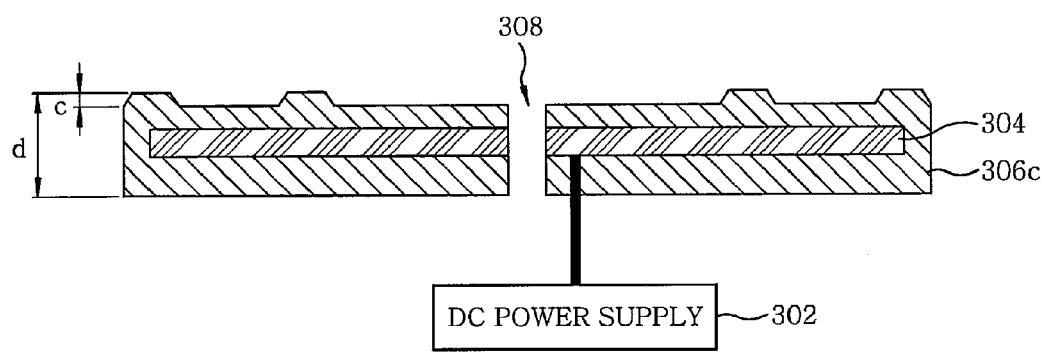

FIGS. 3A to 3C are diagrams illustrating the structure of an electrostatic chuck according to further embodiments in which a specific region of a dielectric is thinned. An electrostatic chuck structure shown in each of those figures may include a DC power supply 302, a conductor 304, a corresponding one of dielectrics 306a to 306c, and a gas supply unit 308. In each of the dielectrics 306a to 306c, a thickness of a specific region, denoted d, is larger by a predetermined value c than a thickness of a region excluding the specific region.

Referring to FIG. 3A, an electrostatic chuck structure may include: a DC power supply 302 for supplying positive (+) or negative (−) DC power; a conductor 302 functioning as an electrode, to which DC power may be supplied, to generate an electrostatic force; a dielectric 306a surrounding the conductor 302, the dielectric 206 being made of a polyimide-based ceramic material; and a gas supply unit 308 for supplying cooling gas, such as helium (He) gas.

Here, at least one specific region of the dielectric 306a has a thickness relatively larger than those of other regions. For example, the thickness of the specific region may be relatively larger by 1 to 10 μm than that of a region excluding the specific region. In the example embodiment of FIG. 3A, the specific region of the dielectric 306a may be formed by making an upper region at each end thereof thick.

Referring next to FIG. 3B, an electrostatic chuck structure may include: a DC power supply 302 for supplying positive (+) or negative (−) DC power; a conductor 302 functioning as an electrode, to which DC power may be supplied, to generate an electrostatic force; a dielectric 306b surrounding the conductor 302, the dielectric 206 being made of a polyimide-based ceramic material; and a gas supply unit 308 for supplying cooling gas, such as helium (He) gas.

Here, at least one specific region of the dielectric 306b has a thickness relatively larger than those of other regions. For example, the thickness of the specific region may be relatively larger by 1 to 10 μm than that of a region excluding the specific region. In the example of FIG. 3B, the specific region of the dielectric 306b may be formed by making an upper region at a central portion thereof thick.

Referring next to FIG. 3C, an electrostatic chuck structure may include: a DC power supply 302 for supplying positive (+) or negative (−) DC power; a conductor 302 functioning as an electrode, to which DC power may be supplied, to generate an electrostatic force; a dielectric 306c surrounding the conductor 302, the dielectric 206 being made of a polyimide-based ceramic material; and a gas supply unit 308 for supplying cooling gas, such as helium (He) gas.

Here, at least one specific region of the dielectric 306c has a thickness relatively larger than those of other regions. For example, the thickness of the specific region may be relatively larger by 1 to 10 μm than that of a region excluding the specific region. In the embodiment of FIG. 3C, the specific region of the dielectric 306c may be formed by making an upper region at each end thereof and a predetermined upper region at a portion spaced by a predetermined distance from the end thick.

In each of the above-described electrostatic chuck structures, the electrostatic chucking force is changed. When the specific region of the dielectric is made thin, the force is large, the etching rate is increased, and the CD uniformity is decreased. On the other hand, when the specific region of the dielectric is made thick, the chucking force is small, the etching rate is decreased, and the CD uniformity is increased. The etching rate and the CD uniformity depend on the electrostatic chucking force because the electrostatic chucking force influences a cooling effect of a cooling gas, such as helium, to be supplied on the back side of the semiconductor wafer.

With the electrostatic chuck in which the specific region of the dielectric has a different thickness, thereby affecting the electrostatic chucking force and in turn the cooling effect of the cooling gas, the etching rate and the CD uniformity can be improved.

As described above, unlike the known electrostatic chuck structure in which the conductor and the dielectric have a uniform thickness, according to disclosed embodiments, in an electrostatic chuck for supporting and fixing a semiconductor wafer, the specific region of the conductor or dielectric has a thickness relatively smaller or larger than those of other regions. Therefore, the etching rate and the CD uniformity can be improved during the semiconductor manufacturing process, and as a result, the yield of the semiconductor device can be improved.

While the present invention has been described with respect to the preferred embodiment, it will be apparent to those skilled in the art that various changes and modifications may be made without departing from the scope of the present invention as defined in the following claims.

What is claimed is:

1. An electrostatic chuck structure for fixing a semiconductor wafer during a semiconductor manufacturing process, the electrostatic chuck structure comprising:
   a power supply configured to supply electrical power;
   a conductor to which the electrical power is supplied, at least one specific region thereof having a thickness smaller than those of other regions;
   a dielectric surrounding the conductor with a substantially uniform thickness; and
   a gas supply unit passing through the conductor and the dielectric to supply cooling gas.

2. The electrostatic chuck structure of claim 1, wherein the specific region of the conductor has a thickness ranging from 0.2 to 0.5 mm, and a region excluding the specific region thereof has a thickness ranging from 1 to 2 mm.

3. An electrostatic chuck structure for fixing a semiconductor wafer during a semiconductor manufacturing process, the electrostatic chuck structure comprising:
   a power supply configured to supply electrical power;
   a conductor to which the electrical power is supplied, at least one specific region thereof having a thickness smaller than those of other regions;
   a dielectric surrounding the conductor, at least one specific region thereof having a thickness larger than those of other regions; and
   a gas supply unit passing through the conductor and the dielectric to supply cooling gas.

4. The electrostatic chuck structure of claim 3, wherein the specific region of the conductor has a thickness ranging from 0.2 to 0.5 mm, and a region excluding the specific region thereof has a thickness ranging from 1 to 2 mm.

5. The electrostatic chuck structure of claim 3, wherein the specific region of the dielectric has a thickness larger by 1 to 10 μm than those of other regions.

* * * * *